United States Patent

[11] 3,569,746

[72] Inventors Jacques Lacour
Grenoble;
Pierre Rousseau, Sayssinet-les-Iles, France
[21] Appl. No. 7,411
[22] Filed Feb. 6, 1970
[45] Patented Mar. 9, 1971
[73] Assignee Commissariat A L'Energie Atomique
Paris, France
[32] Priority Apr. 15, 1966
[33] France
[31] 57862
Continuation of Ser. No. 630,722, Apr. 13, 1967, now abandoned.

[54] HIGH SPEED NONSATURATING LOGIC CIRCUIT
3 Claims, 7 Drawing Figs.

[52] U.S. Cl. 307/296, 307/215, 307/218, 307/237, 307/300, 330/30
[51] Int. Cl. H03k 19/08
[50] Field of Search 307/207, 215, 218, 237, 280, 296, 300; 330/30 (D)

[56] References Cited
UNITED STATES PATENTS

| | | | |
|---|---|---|---|
| 3,320,551 | 5/1967 | Miller | 307/237X |
| 3,378,695 | 4/1968 | Marette | 307/213X |
| 3,431,505 | 3/1969 | Diagostino | 330/30 |

OTHER REFERENCES

IBM Technical Bulletin, Vol. 8, No. 1, June 1965 " Shift Cell for Current Switching Circuits" by Schmookler 307—215

*Primary Examiner*—John S. Heyman
*Attorney*—Cameron, Kerkam and Sutton

ABSTRACT: A clamping diode is provided in parallel with the load resistance located in the common collector circuit of the input transistors of a conventional emitter coupled nonsaturating logic circuit for OR/NOR operation.

In a modified embodiment using several input blocks a clamping diode is also provided in parallel with the load resistance located in the collector circuit of the bias transistors. The modified embodiment may be used as half adder.

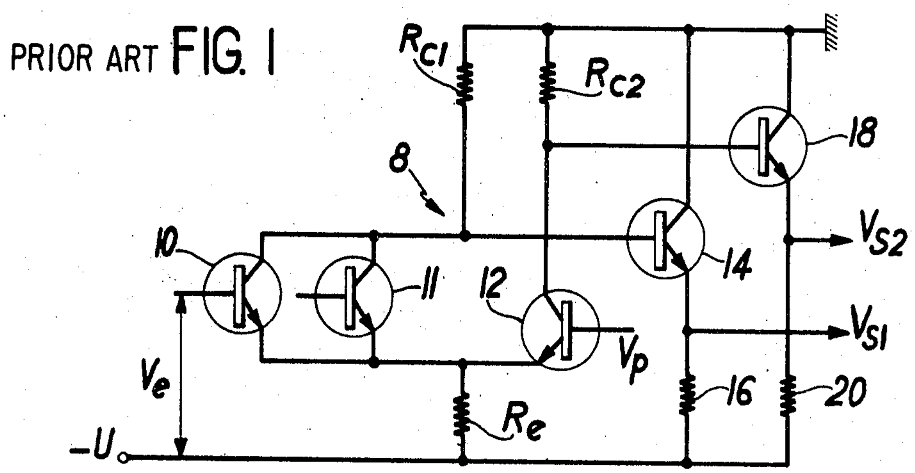
PRIOR ART FIG. 1
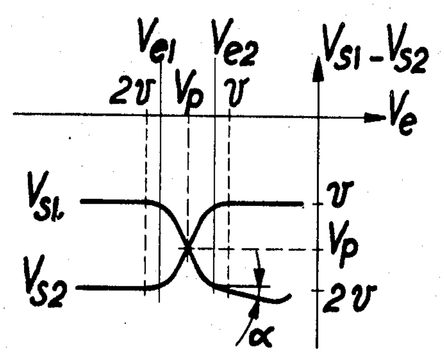
FIG. 2
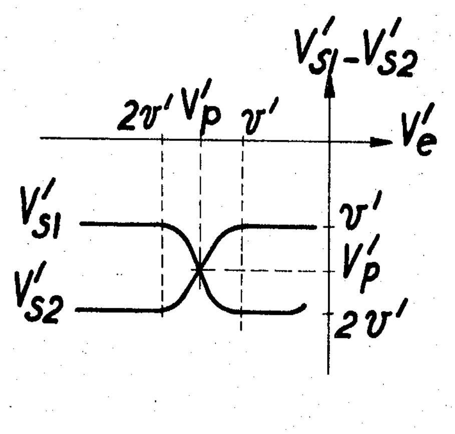
FIG. 4

HIGH SPEED NONSATURATING LOGIC CIRCUIT

This is a continuation of 630,722, filed Apr. 13, 1967.

This invention relates to a binary logic circuit and more especially to an emitter-coupled logic circuit of the nonsaturated transistor type, as well as to a logic system which comprises such circuits and their supply. The invention is directed to the design of a circuit which meets practical requirements more effectively than comparable circuits of the prior art, especially insofar as the output logic levels which characterize its two binary states are determined with higher constancy and insofar as such a circuit has a lower power consumption for equal switching speed.

For the sake of clarity, the expression "logic circuit of the type hereinabove defined" will be employed in the following description and claims to designate a circuit consisting of two output transistors, the base of the first transistor being connected to the collector of a bias transistor which is connected through a first load resistor to one of the poles of a supply generator, and the base of the second transistor being connected to the collectors of a plurality of transistors disposed in parallel and connected through a second load resistor to the same pole of the supply generator, the emitters of all the input transistors and of the bias transistor being connected to the other pole of the supply generator through a common input resistor; the voltages which are representative of the logic levels of the controlled variables are applied to the bases of the input transistors.

In accordance with the invention, the second load resistor placed in the collector circuit which is common to the input transistors is shunted by a diode which establishes the base potential of the second output transistor in one of the equilibrium states and said common input resistor has a value of resistance which is considerably lower than the minimum value which would correspond to an acceptable transfer characteristic in the absence of said diode.

The invention further consists in other arrangements which can advantageously be employed in conjunction with those mentioned in the foregoing. These features will be more readily apparent from the following description of a circuit of known type and of a circuit according to the present invention, the latter being given solely by way of nonlimitative example. The description refers to the accompanying drawings, in which:

FIG. 1 is a diagram of a logic circuit of the type hereinabove defined which is extensively used at the present time;

FIG. 2 is a representative diagram of the transfer characteristic of the logic circuit of FIG. 1;

Figure 3:
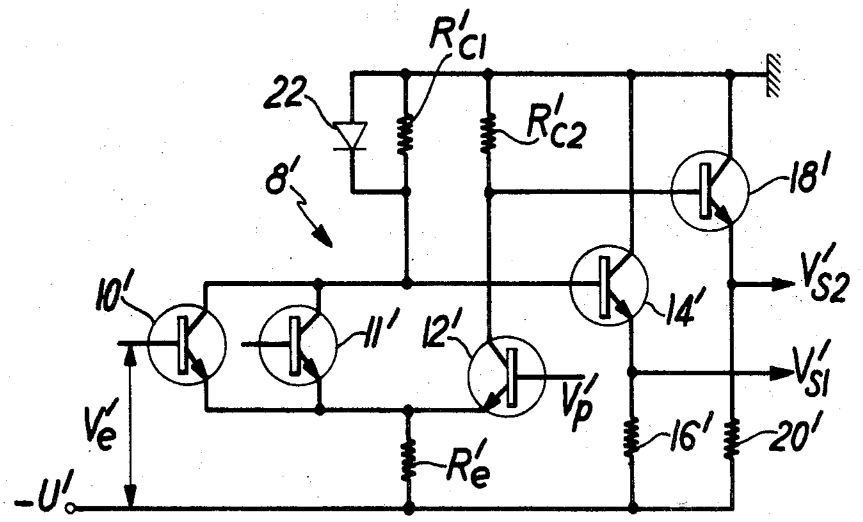
Figure 5:
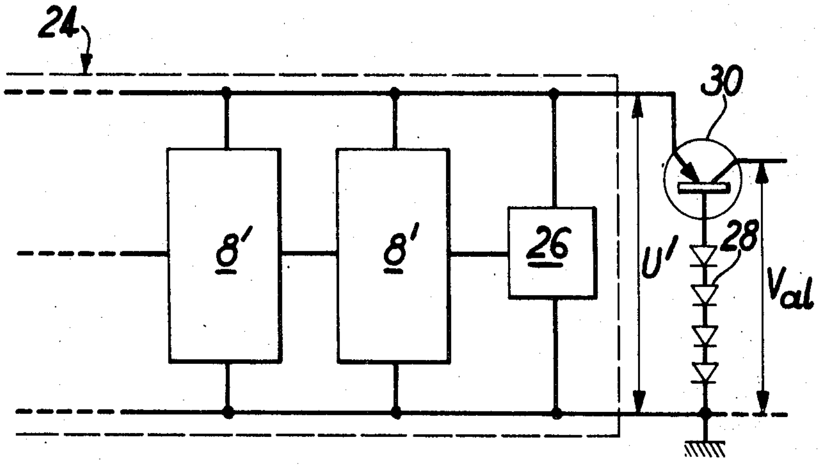
Figure 7:
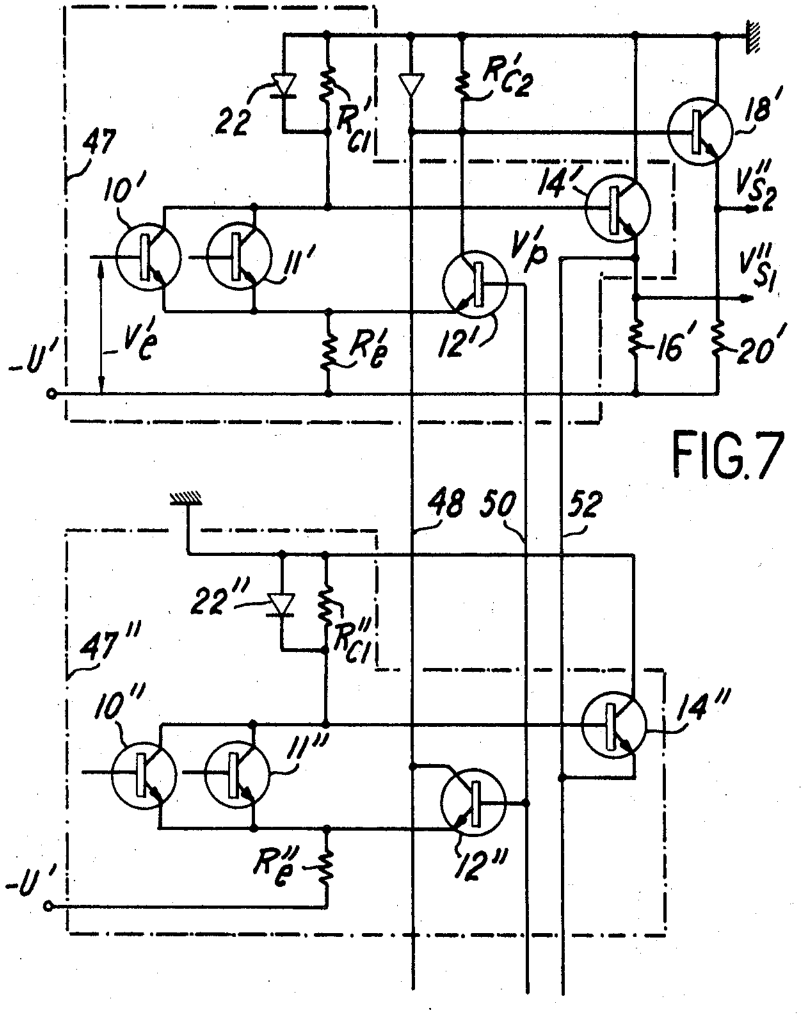
Figure 6:
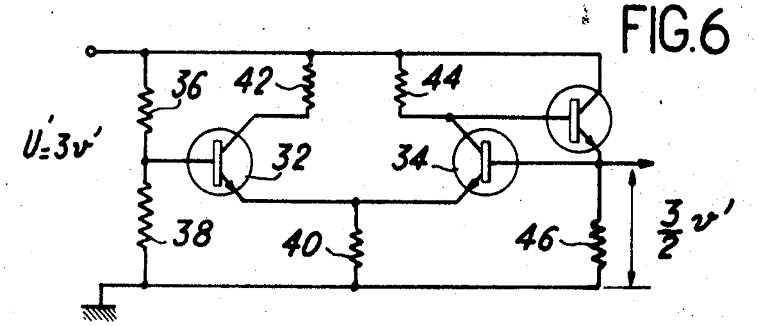

FIG. 3, which is similar to FIG. 1, shows a circuit according to the invention;

FIG. 4, which is similar to FIG. 2, gives the transfer characteristic of the circuit of FIG. 3;

FIG. 5 is a general arrangement diagram of a logic system comprising circuits in accordance with the invention;

FIG. 6 is a stabilized DC voltage generator for use in the circuits of FIGS. 3 and 5; and FIG. 7 is a diagram of a modified embodiment of the present invention.

Among the logic circuits of the type hereinabove defined; the circuit 8 which is shown in FIG. 1 is frequently met with. It comprises a plurality of NPN input transistors (two transistors 10, 11 being shown in the FIG.), the collectors of which are connected to ground through a resistor $R_{c1}$ and the emitters of which are brought to a negative potential through a common resistor $R_e$ which is connected to a suitable negative voltage source $-U$. The logic levels which can be assumed by each of the controlled variables $X$, $Y$, etc... are applied in the form of voltages $V_e$ to the bases of the transistors 10, 11, etc... A bias circuit which is symmetrical with the preceding comprises an NPN transistor 12, the emitter of which is also connected through the resistor $R_e$ to the negative voltage source $-U$ and the base of which is bought to a constant potential $V$p whilst the collector is connected to ground through a resistor $R_{c2}$ of the same order as $R_{c1}$.

The collectors of the transistors 10, 11, etc... are coupled in parallel to the base of the second output transistor 14, the collector of which is connected to ground. If the logical value 1 is assigned to the highest voltage and the logical value 0 assigned to the lowest voltage, the emitter of the transistor 14 supplies to a load resistor 16 a voltage $V_{s1}$ which is representative of $X + Y + \ldots$, which is the complement of the logical sum of $X$, $Y$, etc... Similarly, the collector of the transistor 12 is coupled to the first output transistor 18 which supplies through a resistor 20 a voltage $V_{s2}$ which is representative of the logical sum $X + Y + \ldots$ (which is also written: $X$ OR $Y$ OR...)

The transfer characteristic of the circuit 8 is shown diagrammatically in FIG. 2, wherein $v$ designates the saturation voltage of the diode (base-emitter) of the transistors in respect of the current applied at 25° C. and wherein $$Vp=\frac{3}{2}\underline{v}$$

(− 1.15 volt at 25° C., for example). It is apparent that, when at least one of the transistors 10, 11, etc.., is brought from the voltage $V_{e1}$ to the voltage $V_{e1}$, the voltages $V_{s1}$ and $V_{s2}$ pass from one logic level to another according to the required characteristics of an OR circuit. However, it is also apparent that the rectilineal position of the curve which is representative of $V_{s1}$ is not horizontal but inclined at an angle $\alpha$ such that:

$$tg\alpha=\frac{Rc1}{Re}$$

In respect of an input level which is equal to $v$ and characteristic of one of the binary states, we therefore have an output level $V_s$ which is different from the value $2v$ which is characteristic of the other binary state, thus resulting is dissymmetry.

It is possible to produce action only on $R_e$ in order to modify $tg\ \alpha$. But, in that case, two contradictory requirements are encouraged encountered:

The switching speed being directly dependent on the current $$i=\frac{U-Vp}{Re}$$

which flows through the transistors 10, 11, etc..., it is advisable to adopt a low value of $R_e$ in order to maintain a low value of $U$ (in respect of a given switching speed): in fact, the power $U \times i$ which is dissipated in the circuit and which has to be removed must be maintained at as low a value as possible inasmuch as it constitutes one of the factors which limit the integration of the circuits.

In order that the logic level should be as constant as possible, it is important to ensure that $tg\ \alpha$ should be small and that $R_e$ should therefore be high.

Thus, it proves necessary to adopt for $R_e$ a compromise value which, with the numerical values given above, can be $R_e$ = 1200 106, which corresponds to a slope of the order of 0.25 and to a supply voltage $U = 5.2$ volts.

The invention makes it possible to avoid the need for such a compromise by fixing the base potential of the transistor 14 when this latter is in the conducting state. To this end, the invention proposes the circuit 8' which is shown in FIG. 3, wherein the elements corresponding to those of FIG. 1 bear the same reference numerals followed by the prime index.

The circuit of FIG. 3 comprises a semiconductor diode 22 which is mounted in parallel across the resistor $R_{c1}$. The presence of this diode, or so called clamping diode, serves to fix the base potential of the transistor 14' and to reduce the value of $R_e$ while improving the transfer characteristic $V'_{s1}$, as shown in FIG. 4: the angle $\alpha$ is a zero and there only remains the terminal flexion point which corresponds to the saturation of the transistor 12'. Assuming, for example, that $R_e = 150\ \Omega$ whilst $v' = -1.15$ volt and $$\underline{V'p}=-\frac{3}{2}v$$

it is merely necessary to adopt $U=3v$, namely 2.25 volts approximately. By way of example, it is possible in this case to make use of resistors 16 and 20 having a value of 1000 ohms and a resistor $R_c2$ of 330 ohms by retaining $$\underline{\mathrm{Vp}}=\frac{3}{2}v$$

therefore $$\underline{\mathrm{Vp}}=\frac{U}{2}$$

There can be employed as diode 22 a transistor whose base and collector are connected and grounded and whose emitter is connected to the base of the transistors 10', 11',...

The advantage of the circuit according to the invention is readily apparent: the power which is dissipated by the circuit 8' is very much smaller. In the case of numerical characteristics given above, the power which is dissipated in the circuit 8' is 12.5 mW. at 25° C. as compared with 35 mW. in the case of corresponding circuit 8, 12.5 mW. being dissipated in the supply circuit 8'; this power obviously varies as a function of the temperature between 6.8 mW. at 125° C. and 20 mW. at −55° C.: it is apparent that some degree of compensation is achieved inasmuch as the circuits 8' dissipate a smaller amount of heat if the temperature rises.

In consequence, it will be possible to reduce the volume occupied by the integrated circuits of the type hereinabove defined to a substantial extent or, in respect of a given volume, to simplify the difficult problem of removal of the heat which is dissipated.

The reduction in power consumption is such as to permit the development of logic systems with stabilized supplies which therefore ensure improved operation while nevertheless retaining an overall consumption which is distinctly lower than that of systems which utilize circuits 8. FIG. 5 shows a board 24 on which are mounted logic circuits 8' (provision being made for 25 circuits, for example) and a biasing unit 26. The supply circuit provides a voltage $U'$ which is equal to $3v'$ ($v'$ being the diode saturation voltage) and the bias circuit divides said voltage so as to produce $V'_p$; said supply circuit comprises a source which supplies a voltage $V_{a1}$ which is rectified and filtered to within only 20 percent and having a mean value 4 $v'$ max. +20 percent ($v'$ max. corresponding to the maximum saturation value, that is to say at minimum temperature), and a ballast circuit constituted by four diodes 28 in series with a transistor 30: said ballast circuit makes it possible to maintain a supply voltage $U'=3\,v'$ ; it is merely necessary to divide this voltage by 2 in order to obtain the bias voltage.

It is possible for example, to employ as a biasing unit 26 the circuit which is illustrated in FIG. 6 as constituted by a dividing bridge comprising two transistors 32 and 34 mounted in opposition. The resistors 36 and 38 are of equal value, namely 400 ohms, for example. The resistor 40 can also have a value of 400 ohms whilst the resistors 42 and 44 are rated at 800 ohms. The resistor 46 can in that case have a value of 2200 ohms.

In the case of the values given above for the bias circuit and the ballast circuit and corresponding to a temperature of 25° C., the power dissipated by the ballast circuit is the same as that which is dissipated by the bias circuits; the total dissipated power is therefore still only 25 mW per circuit, that is to say lower than the power which is dissipated in the single circuit 8. Furthermore, it is known that the removal of the power which is dissipated within the supply ballast circuit does not present any difficulty.

The alternative form of execution of the invention which is illustrated in FIG. 7 makes it possible to obtain an output voltage $_{S2}=(X_1+X_2+...)\cdot(Y_1+Y_2+...)\cdot(...)$ (1) which is also written ($X_1$ OR $X_2$ OR ..)AND ($Y_1$ OR $Y_2$ OR ...) AND ...

This circuit comprises a plurality of "input flip-flops," this term being employed to designate the assembly which is constituted by the input transistors, the corresponding bias transistor and the output transistor which is coupled to the input transistor: the first input flip-flop of the circuit shown in FIG. 7 and contained within the chain-dotted line frame 47 has the same reference numerals as in FIG. 3; the second flip-flop 47'' is made up of elements which are identical with those of the first and accordingly comprises a plurality of input transistors 10'', 11'',..., a bias transistor 12'', a common resistor $R''_e$ which couples the emitters of the above-mentioned transistors to the negative voltage source $-U'$, and a collector resistor $R''_{C1}$ which is again shunted by a diode 22''. The flip-flop 47'' also comprises an output transistor 14'' which is coupled to the input transistors 10'', 11'',...

Other flip-flop circuits can also be provided and mounted in the same manner as to flip-flop circuit 47''. All the input flip-flops are coupled to each other as indicated in FIG. 7: the collectors of all the bias transistors 12', 14',... are interconnected by means of a conductor 48. All the bases of said transistors are interconnected by a common conductor 50. Finally, the emitters of the output transistors 14', 14'',... are interconnected by a common conductor 52.

In view of the fact that the drive which is provided to the collector of the output transistor 18' by a plurality of transistors 12', 12'',... which can all be simultaneously conducting or all simultaneously blocked, provision is made for a diode 54 which is connected in parallel with the resistor $R'_{c2}$ and the function of which is identical with that of the diode 22 in the case of the resistor $R'_{c1}$. High fan incapability may be achieved,... while maintaining a perfectly horizontal characteristic and without entailing the need to provide resistors $R'_e$, $R''_e$, which have a high value of resistance.

In order to perform the logic operation (1), it is merely necessary to apply voltages which are representative of $X_1X_2$... to the bases of the input transistors of the flip-flop 47, the voltages which are representative of $Y_1Y_2$... to the bases of the input transistors of the flip-flop 47'' and so forth.

The circuit which is shown in FIG. 7 can be employed in a simplified form comprising two flip-flops for the purpose of constituting a half-adder which supplies an output voltage representative of: $X\cdot Y+Y\cdot X$ (2)

It is merely necessary for this purpose to apply to the input transistors 10' and 11' voltages which are representative of $X$ and $Y$ and to the transistors 10'' and 11'' voltages which are representative of $Y$ and $Y$.

It is readily apparent that the invention is not limited solely to the mode of execution which has been illustrated and described herein by way of example: in particular, the invention could be adapted to transistors of different types.

We claim:

1. An integrated nonsaturating emitter-coupled gate circuit comprising:
   - a first output transistor;
   - a bias transistor;
   - conductor means connecting the collector of the bias transistor to the base of said first output transistor;
   - a first load resistance connecting the base of the first output transistor to a DC supply;
   - a second output transistor;
   - conductor means connecting the base of the second output transistor to the collectors of a plurality of input transistors in parallel, all of said transistors being of the same polarity and having a diode characteristic exhibiting a slope change for a forward bias voltage $v$ ,
   - a second load resistance connecting the base of the second output transistor to said DC supply;
   - a common input resistance connecting the other polarity of said DC supply to the emitters of all input transistors and of the bias transistor;
   - a clamping diode located in parallel with said second load resistance for clamping the base voltage of the second output transistor when the latter is in conductive condition thereof, wherein said supply provides a voltage substantially equal to 3 $v$ and said common input resistance has a value which corresponds to a logical swing equal to $v$;

a power supply common to a plurality of said circuits comprising a supply voltage stablilizing ballast consisting of a chain of four diodes in series relation and having a characteristic exhibiting a slope change for said voltage $v$ and a transistor also having a diode characteristic exhibiting a slop change for said voltage $v$, the base of said last named transistor being connected to one end of said chain; and means for applying a voltage higher than $4v$ across the collector of said last named transistor and the other end of said chain whereby said DC supply is available between said other end and the emitter of said last named transistor.

2. An integrated circuit as described in claim 1, including means for applying to the base of the bias transistor a bias voltage equal to one-half of said DC supply.

3. A high-speed nonsaturating logic circuit comprising:

a first output transistor;

a first load resistor connecting the base of said first output transistor to a terminal of a DC supply;

a unidirectionally conducting device in parallel relation with said first load resistor; and a plurality of input blocks in parallel relationship each having:

a second output transistor;

a second load resistor connecting the base of said second output transistor to said terminal;

a unidirectionally conducting device in parallel relation with said second load resistor;

a plurality of input transistors having their collectors connected to the base of said second output transistor;

a bias transistor;

an input resistance connecting the emitters of said input bases transistors to the other terminal of said DC supply; and means for connecting the collectors of the bias transistors of all input blocks to the base of said first output transistor, said supply providing a voltage substantially equal to $3v$ and said common input resistance having a value which corresponds to a logical swing equal to $v$.